United States Patent
Shu et al.

(10) Patent No.: US 8,723,280 B2
(45) Date of Patent: May 13, 2014

(54) HYBRID MEMS BUMP DESIGN TO PREVENT IN-PROCESS AND IN-USE STICTION

(75) Inventors: Chia-Pao Shu, New Taipei (TW);
Wen-Chuan Tai, Hsinchu (TW);
Chia-Ming Hung, Taipei (TW);
Hsiang-Fu Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/563,935

(22) Filed: Aug. 1, 2012

(65) Prior Publication Data

US 2014/0035072 A1 Feb. 6, 2014

(51) Int. Cl.
*H01L 29/82* (2006.01)

(52) U.S. Cl.
USPC ............ 257/417; 257/E21.002; 257/E29.324

(58) Field of Classification Search
USPC ........................... 257/417, E21.002, E29.324
See application file for complete search history.

(56) References Cited

U.S. PATENT DOCUMENTS

| | | | |
|---|---|---|---|
| 8,338,207 B2 * | 12/2012 | Shu et al. | 438/50 |
| 2008/0063790 A1 * | 3/2008 | Reboa | 427/96.5 |
| 2012/0181637 A1 * | 7/2012 | Shu et al. | 257/415 |
| 2012/0313235 A1 * | 12/2012 | Chu et al. | 257/692 |
| 2012/0319528 A1 * | 12/2012 | Jahnes et al. | 310/300 |

* cited by examiner

*Primary Examiner* — David S Blum
(74) *Attorney, Agent, or Firm* — Eschweiler & Associates, LLC

(57) ABSTRACT

A micro-electro-mechanical systems (MEMS) device and method for forming a MEMS device is provided. A proof mass is suspended a distance above a surface of a substrate by a fulcrum. A pair of sensing plates are positioned on the substrate on opposing sides of the fulcrum. Metal bumps are associated with each sensing plate and positioned near a respective distal end of the proof mass. Each metal bump extends from the surface of the substrate and generally inhibits charge-induced stiction associated with the proof mass. Oxide bumps are associated with each of the pair of sensing plates and positioned between the respective sensing plate and the fulcrum. Each oxide bump extends from the first surface of the substrate a greater distance than the metal bumps and acts as a shock absorber by preventing the distal ends of the proof mass from contacting the metal bumps during shock loading.

20 Claims, 5 Drawing Sheets

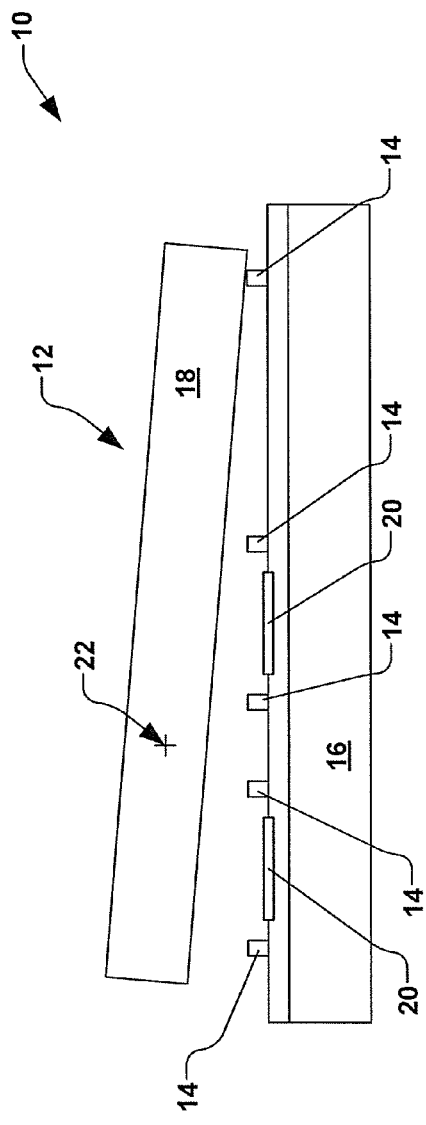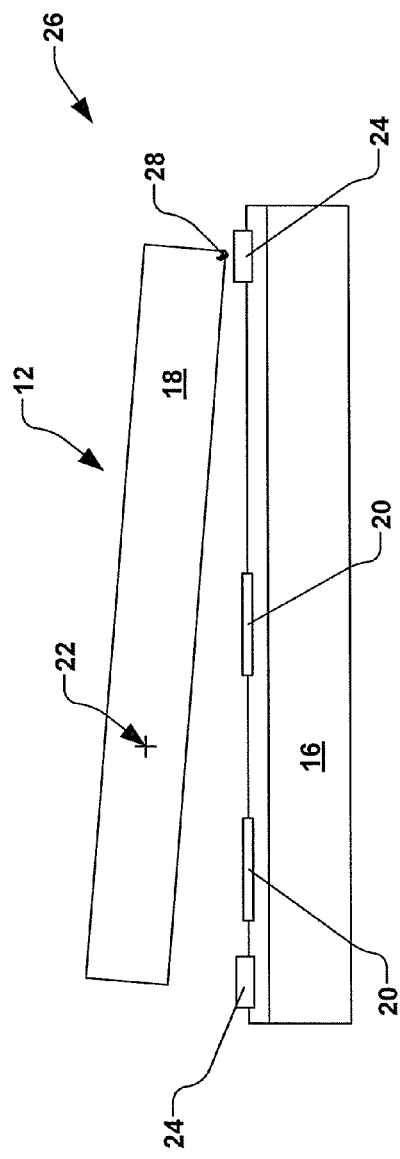

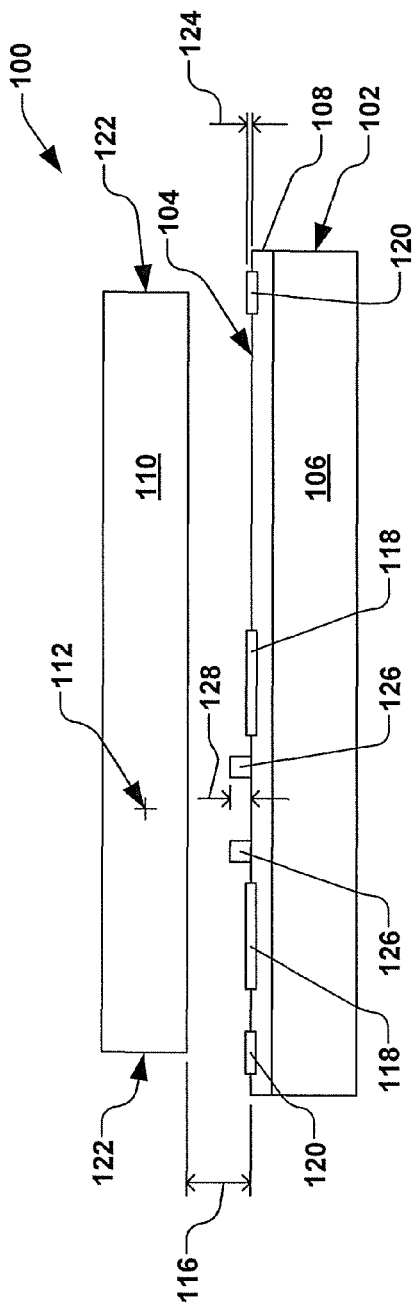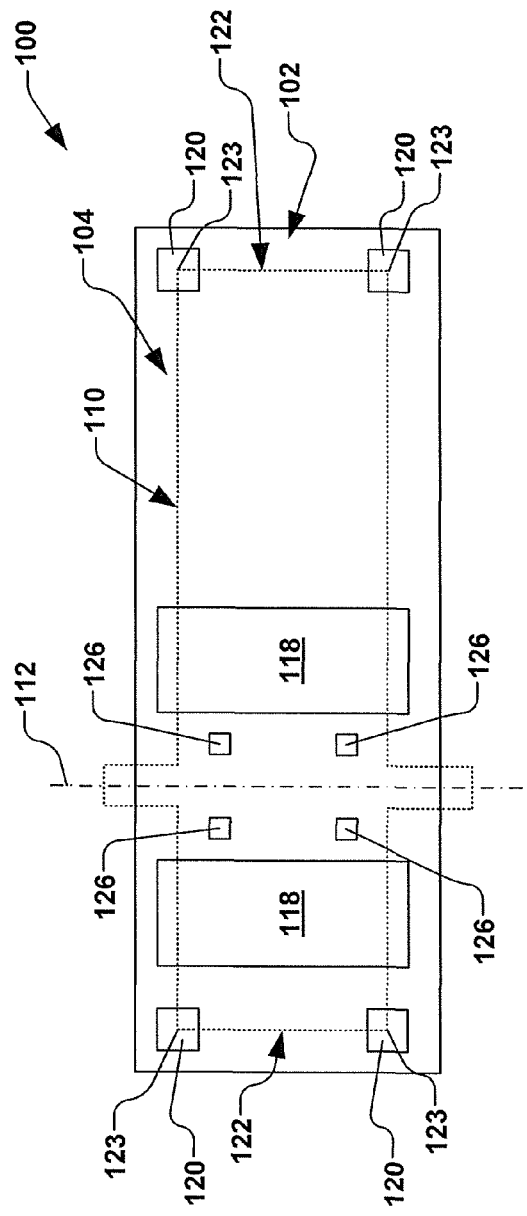

HYBRID MEMS BUMP DESIGN TO PREVENT IN-PROCESS AND IN-USE STICTION

BACKGROUND

In semiconductor manufacturing, the formation of microelectromechanical systems (MEMS) on semiconductor wafers uses tools and techniques that have been previously developed for the Integrated Circuit (IC) industry to build microscopic machines. These MEMS devices can be built at the same time across the surface of the wafer, thereby requiring little to no assembly.

Bulk micromachining is a fabrication technique which builds mechanical elements by starting with a silicon wafer, and then etching away unwanted parts, and being left with useful mechanical devices. MEMS devices are often formed utilizing bulk micromachining, wherein lithographic processes are utilized in MEMS fabrication. In such bulk micromachining, the silicon wafer is patterned and subsequently submersed into a liquid etchant in order to dissolve any exposed silicon. The remaining silicon or other material generally forms the MEMS device.

Various pressure sensors, position sensors, and acceleration sensors, for example, are commonly formed using MEMS fabrication techniques. Such MEMS devices offer numerous advantages over traditional sensors, as they are typically more cost efficient, reliable, relatively easy to manufacture, and there is often very good repeatability between devices.

One reliability problem commonly observed with MEMS devices, however, is stiction, or the adhesion of contacting surfaces due to surface forces. Generally, stiction is the static friction that needs to be overcome in order to enable relative motion of stationary objects that are in contact with one another. When two surfaces with areas below the micrometer range come into close proximity, such as evidenced in MEMS devices, they may adhere together, thus limiting the reliability of the MEMS device. At this scale, the two main failure factors of MEMS devices are electrostatic or charge-induced stiction, and/or Van der Waals force-induced stiction. Such stiction issues present various problems that have heretofore been difficult to address.

SUMMARY

The following presents a simplified summary in order to provide a basic understanding of one or more aspects of the disclosure. This summary is not an extensive overview of the disclosure, and is neither intended to identify key or critical elements of the invention, nor to delineate the scope thereof. Rather, the primary purpose of the summary is to present some concepts of the disclosure in a simplified form as a prelude to the more detailed description that is presented later.

In one embodiment, the present disclosure relates to a micro-electro-mechanical systems (MEMS) device. The MEMS device, for example, comprises a proof mass that is suspended a first distance above a first surface of a substrate by a fulcrum. The fulcrum, for example, is displaced from the center of gravity of the proof mass. The proof mass is configured to rotate about the fulcrum.

A pair of sensing plates are positioned on the first surface of the substrate, wherein the sensing plates are positioned on opposing sides of the fulcrum. The pair of sensing plates and the proof mass, for example, form a capacitance which changes when an acceleration of the substrate is induced in one direction.

In accordance with one exemplary aspect, a metal bump is associated with each sensing plate and positioned near a respective distal end of the proof mass. Each metal bump, for example, extends a distance from the first surface of the substrate and generally inhibits charge-induced stiction associated with the proof mass. Each of the metal bumps, in another example, generally inhibits Van der Waals force stiction associated with the proof mass. In yet another example, a metal bump is arranged on the first surface of the substrate at each respective corner of the proof mass.

According to one aspect, an oxide bump is associated with each of the pair of sensing plates and positioned between the respective sensing plate and the fulcrum. Each oxide bump extends from the first surface of the substrate a greater distance than the metal bumps and acts as a shock absorber by preventing the distal ends of the proof mass from contacting the metal bumps during shock loading. In one example, a plurality of oxide bumps are associated with each of the pair of sensing plates, wherein the plurality of oxide bumps are arranged generally parallel to the fulcrum on the first surface of the substrate.

In accordance with another aspect, a method for forming a MEMS device is provided. The method, in one example, comprises forming a metal layer over a substrate, and patterning the metal layer to form a pair of sensing plates and a plurality of metal bumps. The metal layer, for example, is deposited or otherwise formed on the substrate. A pivot axis of a proof mass is defined between the pair of sensing plates, and each of the plurality of metal bumps are positioned proximate to a respective distal end of the proof mass. Accordingly, each metal bump generally inhibits charge-induced stiction associated with the proof mass.

An oxide layer is further formed over the substrate, and the oxide layer is patterned to form an oxide bump associated with each of the pair of sensing plates. Each oxide bump, for example, is positioned between the respective sensing plate and the pivot axis, wherein each oxide bump generally acts as a shock absorber by preventing the distal ends of the proof mass from contacting the metal bumps during shock loading. Each oxide bump, for example, extends a greater distance from the substrate than the metal bumps.

According to another example, the proof mass is further formed over the substrate, wherein a lower surface of the proof mass is suspended a first distance above a first surface of the substrate by a fulcrum associated with the pivot axis. The proof mass, in one example, comprises a rectangular beam, and wherein each metal bump is associated with a respective corner of the rectangular beam.

BRIEF DESCRIPTION OF THE DRAWINGS

FIG. 1A illustrates cross-sectional view of a MEMS device undergoing charge-induced stiction according to one example.

FIG. 1B illustrates cross-sectional view of another MEMS device having metal scratching issues according to another example.

FIG. 2A illustrates a plan view of an exemplary MEMS device according to one aspect of the disclosure.

FIG. 2B illustrates a cross-sectional view of the MEMS device of FIG. 2B according to another example.

DETAILED DESCRIPTION

Figure 3:
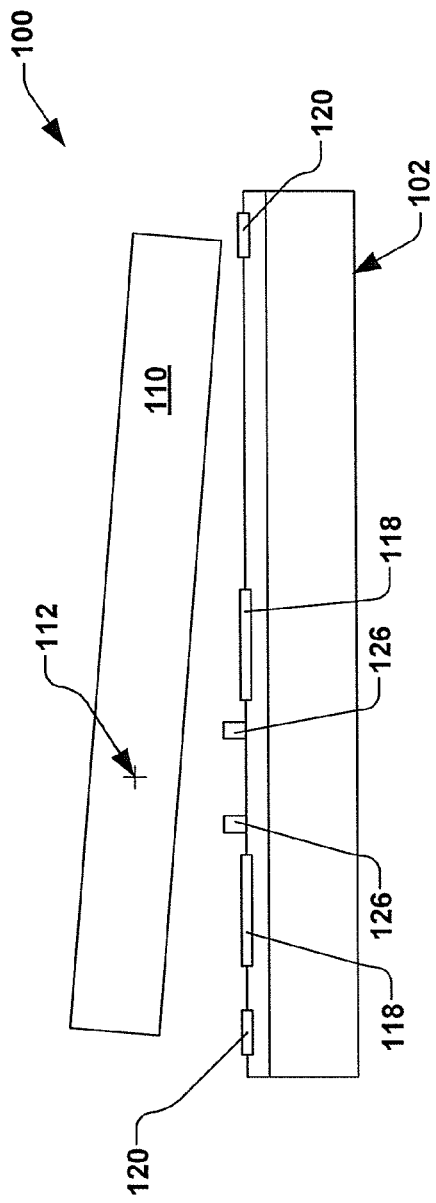
FIG. 3 illustrates a cross-sectional view of a MEMS device where charge-induced stiction is ameliorated by metal bumps according to yet another example.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

In stiction prevention design, an oxide bump can be utilized to prevent stiction when a MEMS device reaches the surface of an underlying substrate. There are two main failure factors regarding stiction in MEMS devices, however; one factor is charge-induced stiction, and the factor other is Van der Waals force-induced stiction.

One way of lowering stiction problems involves minimizing a contact area between the MEMS device and the underlying substrate by utilizing an oxide bump design. As illustrated in FIG. 1A, an oxide bump design 10 for a MEMS device 12 provides small oxide bumps 14 formed on a substrate 16 in order to limit the contact between a proof mass 18 of the MEMS device and the substrate. In desired operation of the MEMS device 12, sensing plates 20 on the substrate 16 are configure to sense a capacitance change when the proof mass 18 rotates about a pivot axis 22. Because oxides are generally not electrically conductive, however, the above-referenced failure factors can still be suffered with utilizing merely the oxide bumps 14 of the oxide bump design 10. Accordingly, the stiffness of MEMS device 12 is limited to a certain range and cannot be reduced when utilizing an oxide bump design 10, alone, due to stiction issues associated with contact between the proof mass 18 and the oxide bumps 14.

The oxide bump design 10 of FIG. 1A thus suffers stiction issues that could be induced from charging, as well as Van der Waals forces. However, while the oxide bump design 10 suffers from stiction, it passes the shock test, since the oxide bumps 14 provide an adequate cushion for the MEMS device 12 during shock loading. In the metal bump design 26 of FIG. 1B, the stiction issue is improved, but the metal bumps 24 may induce the scratch issues during shock testing.

Thus, in accordance with the present disclosure, a hybrid bump design is provided, wherein metal bumps are provided near edges of the MEMS device 12 in order to ameliorate charging-induced stiction and in-process stiction, while oxide bumps are provided near the pivot axis 22 in order to ameliorate the stiction during shock testing, and preventing the above-described scratch issues.

Referring now to FIGS. 2A and 2B, an exemplary MEMS device 100 is provided. As can be seen in FIG. 2A, for example, a substrate 102 having a first surface 104 is provided. The substrate 102, for example, comprises a semiconductive base material 106, such as a silicon, and may further comprise one or more additional layers 108 formed thereover. The one or more additional layers 108, for example, comprise an inter-metal dielectric (IMD) layer, such as an oxide, nitride, or other similar layer.

In accordance with one example, a proof mass 110 having a fulcrum 112 associated therewith is provided, wherein a lower surface 114 of the proof mass is suspended a first distance 116 above the first surface 104 of the substrate 102 via the fulcrum. The proof mass 110 is thus configured to rotate about the fulcrum 112, such as during an acceleration of the MEMS device 100 in a direction generally orthogonal to the first surface 104. The fulcrum 112, for example, is further displaced from the center of gravity of the proof mass. The proof mass 110, for example, is formed of a non-conductive material, such as an oxide, in a manner as will be known to one of ordinary skill in the art.

A pair of sensing plates 118, for example, are associated with the first surface 104 of the substrate 102, wherein the pair of sensing plates are generally positioned on opposing sides of the fulcrum 112. The pair of sensing plates 118, for example, are formed of an electrically conductive metal, wherein the pair of sensing plates and the proof mass 110 form a capacitance which changes when an acceleration of the substrate 102 is induced one or more directions.

According to another example, one or more metal bumps 120 is associated with each of the pair of sensing plates 118, wherein each metal bump is positioned proximate to a respective distal end 122 of the proof mass 110. A plurality of metal bumps 120 may be associated with each of the pair of sensing plates 118, such as illustrated in the example of FIG. 2B, wherein the plurality of metal bumps are arranged on the first surface 104 of the substrate 102 at respective corners 123 of the proof mass 110. As illustrated in FIG. 2A, for example, each metal bump 120 extends a second distance 124 from the first surface 104 of the substrate 102 and generally inhibits charge-induced stiction associated with the proof mass 110, as shown in FIG. 3. Further, the metal bumps 120 generally inhibit the above-described Van der Waals force stiction associated with the proof mass 110. The one or more metal bumps 120, for example, are patterned and/or otherwise formed from a metal layer (not shown).

Figure 4:
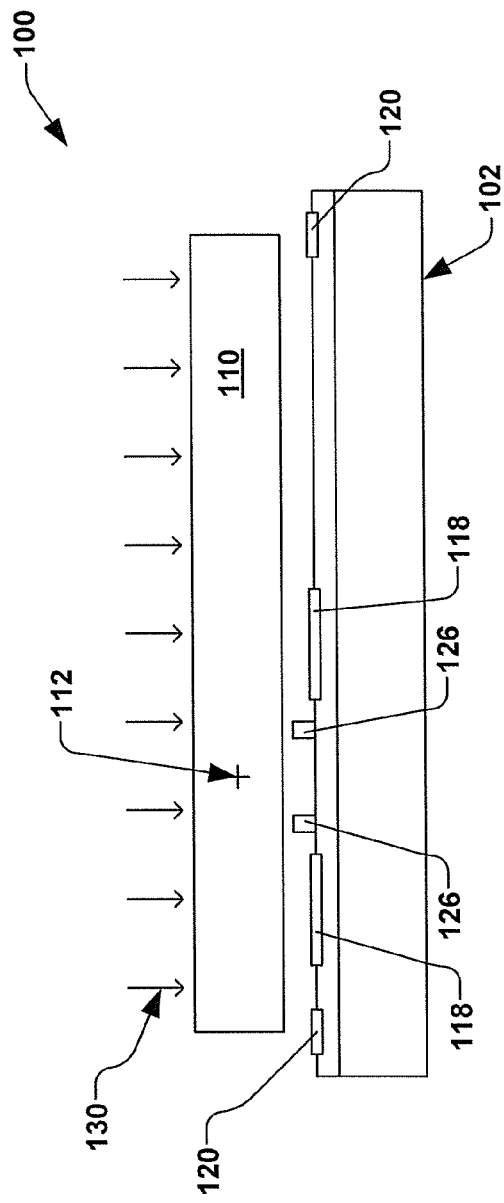
FIG. 4 illustrates a cross-sectional view of a MEMS device where shock-induced metal scratches are ameliorated by oxide bumps according to still another example.

One or more oxide bumps 126, for example, is further associated with each of the sensing plates 118 and positioned between the respective sensing plate and the fulcrum 112. Each of the one or more oxide bump 126, for example, extends a third distance 128 from the first surface 104 of the substrate 102, wherein the one or more oxide bumps generally act as a shock absorber by preventing the distal ends 122 of the proof mass 110 from contacting the metal bumps 120 during shock loading 130, as shown in FIG. 4. A plurality of oxide bumps 126, for example, may be associated with each of the pair of sensing plates 118, wherein the plurality of oxide bumps are arranged generally parallel to the fulcrum 112 on the first surface 104 of the substrate 102. Each oxide bump 126, for example, is formed from a passivation layer (e.g., a dielectric layer), such as an oxide or nitride layer.

Figure 5:
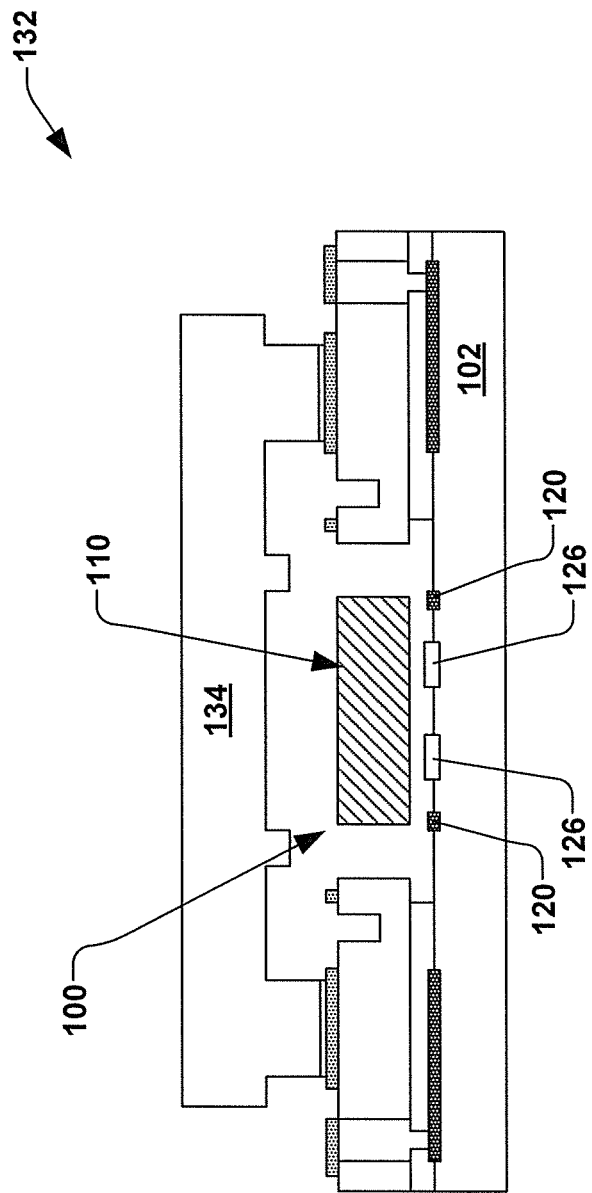
FIG. 5 illustrates a cross-sectional view of another MEMS device where according to a further example.

FIG. 5 illustrates an exemplary CMOS package 132 incorporating the MEMS device 100 described above. The CMOS package 132, for example, comprises the metal bumps 120 and oxide bumps 126 which generally prevents stiction between the proof mass 110 and substrate 102, as well as ameliorates shock-induced metal scratches described above. The CMOS package 132 generally protects the MEMS device via a protective cap 134, as will be understood by one of ordinary skill in the art.

Figure 6:
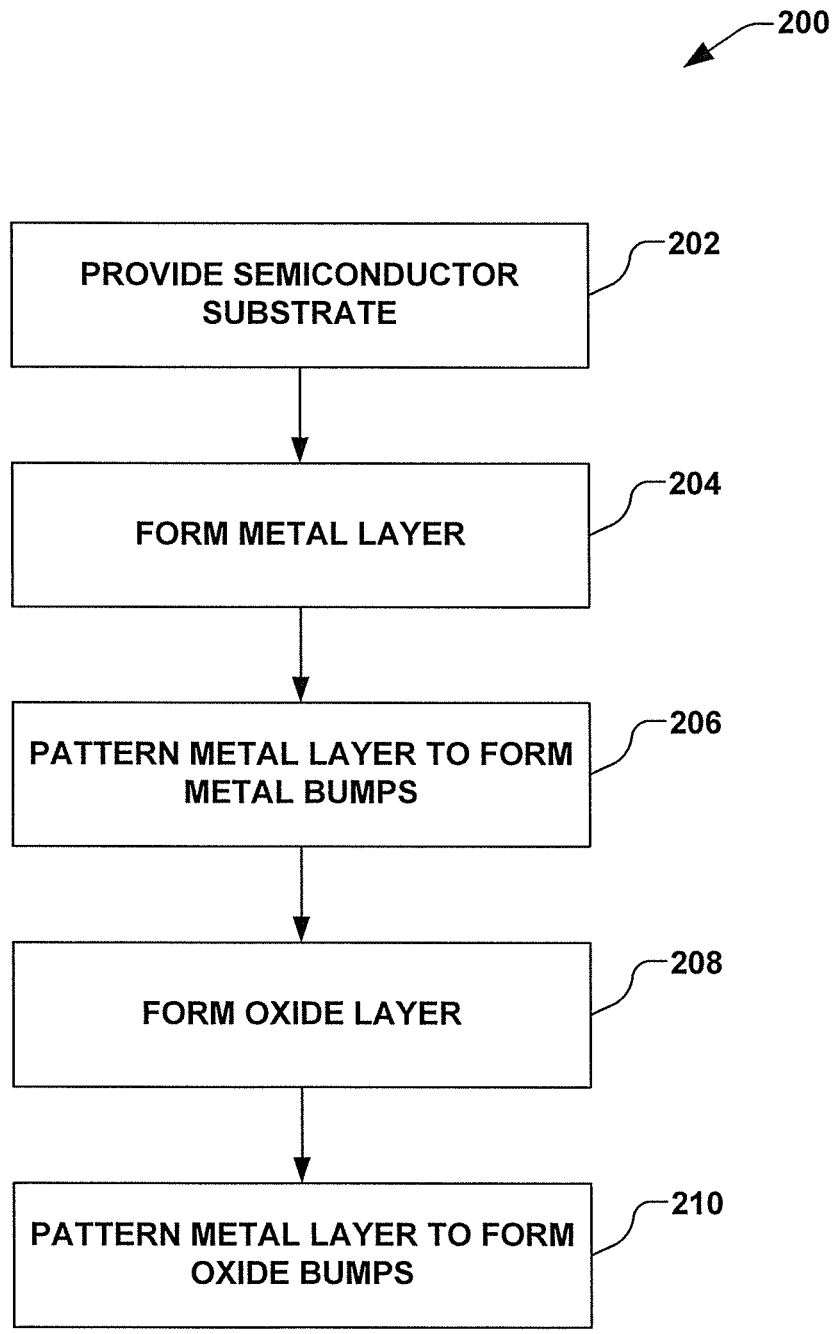
FIG. 6 illustrates an exemplary flow diagram of a method for forming a MEMS device.

In accordance with another embodiment, an exemplary method 200 for forming a MEMS device is provided in FIG. 6, such as the MEMS device 100 described above in FIGS. 2-5, is further provided. As illustrated in FIG. 6, the method 200 comprises providing a substrate, such as a silicon substrate, in act 202. A metal layer is formed over the substrate in act 204, such as by depositing a metal on the substrate, and the metal layer is patterned in act 206 in order to form a pair of sensing plates and a plurality of metal bumps. A pivot axis of a proof mass, such as illustrated in FIG. 2A, is defined between the pair of sensing plates, and wherein each of the plurality of metal bumps formed in act 206 of FIG. 6 are positioned proximate to a respective distal end of the proof mass. Each metal bump generally inhibits charge-induced stiction associated with the proof mass.

In act 208, for example, an oxide layer is formed over the substrate, and in act 210, the oxide layer is patterned in order to form an oxide bump associated with each of the pair of sensing plates. Each oxide bump, for example, is formed and patterned in acts 208 and 210 in order to extend a greater distance from the substrate than each metal bump. Each oxide bump, for example, is further positioned between the respective sensing plate and the pivot axis, such as illustrated again in FIG. 2A, wherein each oxide bump generally acts as a shock absorber by preventing the distal ends of the proof mass from contacting the metal bumps during shock loading.

Subsequent processing can include forming the proof mass over the substrate, wherein a lower surface of the proof mass is suspended a first distance above a first surface of the substrate by a fulcrum associated with the pivot axis. The proof mass, for example, may comprises a rectangular beam, such as illustrated in FIG. 2B, and each metal bump is associated with a respective corner of the rectangular beam.

Accordingly, as discussed in the present disclosure, the metal bumps 120 and oxide bumps 126 of FIGS. 2A and 2B, for example, can improve previous deleterious issues associated with stiction seen with previous devices (e.g., such as the MEMS device 12 of FIGS. 1A and 1B), wherein charge build-up is ameliorated by the electrically conductive metal bumps 120. As illustrated in FIG. 1B, for example, stiction failure rates of the MEMS device 12 are improved by the metal bumps 24; however, the metal bumps may induce metal scratches 28 when shock testing the MEMS device. (Shock testing is one of various reliability tests, particularly for MEMS devices). The metal scratches 28 tend to induce two related deleterious issues; one issue being particle-induced electrical shorting between the MEMS device 12 and the substrate 16, and the other issue is a performance shift due a change in the weight of the proof mass 18 that is caused by the metal scratches 28. The present disclosure utilizes a hybrid approach of metal bumps and oxide bumps, such as seen in FIGS. 2A and 2B, wherein stiction issues are dramatically reduced, while ameliorating scratch issues seen heretofore.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

While the method(s) provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A micro-electro-mechanical systems (MEMS) device, comprising:
   a substrate having a first surface;
   a proof mass having a fulcrum, wherein a lower surface of the proof mass is suspended a first distance above the first surface of the substrate by the fulcrum, and wherein the proof mass is configured to rotate about the fulcrum;
   a pair of sensing plates associated with the first surface of the substrate and positioned on opposing sides of the fulcrum;
   a metal bump associated with each of the pair of sensing plates and positioned proximate to a respective distal end of the proof mass, wherein each metal bump extends a second distance from the first surface of the substrate; and
   an oxide bump associated with each of the pair of sensing plates and positioned between the respective sensing plate and the fulcrum, wherein each oxide bump extends a third distance from the first surface of the substrate.

2. The MEMS device of claim 1, comprising a plurality of metal bumps associated with each of the pair of sensing plates, wherein the plurality of metal bumps are arranged on the first surface of the substrate at respective corners of the proof mass.

3. The MEMS device of claim 1, comprising a plurality of oxide bumps associated with each of the pair of sensing plates, wherein the plurality of oxide bumps are arranged generally parallel to the fulcrum on the first surface of the substrate.

4. The MEMS device of claim 1, wherein the substrate comprises silicon.

5. The MEMS device of claim 4, wherein the substrate further comprises a one or more of an oxide layer and a metal layer formed over the silicon, therein defining the first surface of the substrate.

6. The MEMS device of claim 1, wherein each of the metal bumps generally inhibits Van der Waals force stiction associated with the proof mass.

7. The MEMS device of claim 1, wherein the fulcrum is displaced from the center of gravity of the proof mass.

8. The MEMS device of claim 1, wherein the pair of sensing plates and the proof mass form a capacitance which changes with an acceleration of the substrate induced in one direction.

9. A micro-electro-mechanical systems (MEMS) device, comprising:
   a substrate;
   a proof mass suspended over the substrate by a fulcrum, wherein the proof mass is configured to rotate about the fulcrum;
   first and second sensing plates disposed on respective sides of the fulcrum on the substrate;
   a plurality of metal bumps disposed on the substrate and positioned proximate to each distal end of the proof mass, wherein each of the plurality of metal bumps extends from the substrate; and
   a plurality of oxide bumps disposed on the substrate and positioned between the respective first and second sensing plates and the fulcrum, wherein each of the plurality of oxide bumps extend from the substrate a greater distance than the plurality of metal bumps.

10. The MEMS device of claim 9, wherein the proof mass is generally rectangular, and wherein the plurality of metal bumps are arranged on a surface of the substrate proximate to respective corners of the proof mass.

11. The MEMS device of claim 9, wherein the plurality of oxide bumps comprise at least two oxide bumps arranged on a surface of the substrate generally parallel to the fulcrum and on each side of the fulcrum.

12. The MEMS device of claim 9, wherein the plurality of metal bumps generally inhibits Van der Waals force stiction associated with the proof mass.

13. The MEMS device of claim 9, wherein the fulcrum is displaced from the center of gravity of the proof mass.

14. The MEMS device of claim 9, wherein the first and second sensing plates and the proof mass form a capacitance which changes with an acceleration of the substrate induced in one direction.

15. A micro-electro-mechanical systems (MEMS) device, comprising:
   a substrate;
   a proof mass suspended over the substrate by a fulcrum, wherein the proof mass is configured to rotate about the fulcrum;
   first and second sensing plates disposed on the substrate and respectively associated with opposing sides of the fulcrum;
   a plurality of metal bumps disposed on the substrate, wherein the plurality of metal bumps are positioned proximate to opposing distal ends of the proof mass, wherein each of the plurality of metal bumps extends from the substrate toward the proof mass; and
   a plurality of oxide bumps disposed on the substrate, wherein the plurality of oxide bumps are positioned between the fulcrum and the respective first and second sensing plates, wherein each of the plurality of oxide bumps extend from the substrate toward the proof mass a greater distance than the plurality of metal bumps extend from the substrate toward the proof mass.

16. The MEMS device of claim 15, wherein the proof mass is generally rectangular, and wherein the plurality of metal bumps are arranged on a surface of the substrate proximate to respective corners of the proof mass.

17. The MEMS device of claim 15, wherein the plurality of oxide bumps comprise at least two oxide bumps arranged on a surface of the substrate generally parallel to the fulcrum and on each side of the fulcrum.

18. The MEMS device of claim 15, wherein the plurality of metal bumps generally inhibits Van der Waals force stiction associated with the proof mass.

19. The MEMS device of claim 15, wherein the fulcrum is displaced from the center of gravity of the proof mass.

20. The MEMS device of claim 15, wherein the first and second sensing plates and the proof mass form a capacitance that changes when an acceleration of the substrate is induced in one direction.

* * * * *